United States Patent
Nakamichi

[11] Patent Number: 6,127,206
[45] Date of Patent: Oct. 3, 2000

[54] SEMICONDUCTOR DEVICE SUBSTRATE, LEAD FRAME, SEMICONDUCTOR DEVICE AND METHOD OF MAKING THE SAME, CIRCUIT BOARD, AND ELECTRONIC APPARATUS

[75] Inventor: Tadahiro Nakamichi, Sakata, Japan

[73] Assignee: Seiko Epson Corporation, Tokyo, Japan

[21] Appl. No.: 09/194,067

[22] PCT Filed: Mar. 24, 1998

[86] PCT No.: PCT/JP98/01262

§ 371 Date: May 3, 1999

§ 102(e) Date: May 3, 1999

[30] Foreign Application Priority Data

Mar. 24, 1997 [JP] Japan ................................ 9-070269
Aug. 20, 1997 [JP] Japan ................................ 9-239083
Feb. 20, 1998 [JP] Japan ............................. 10-056146

[51] Int. Cl.[7] .......................... H01L 21/44; H01L 23/495
[52] U.S. Cl. ......................... 438/111; 438/123; 257/666; 257/673
[58] Field of Search .................. 438/111, 123; 257/666, 673

[56] References Cited

U.S. PATENT DOCUMENTS 3,319,388  5/1967  Olsen.
5,389,818  2/1995  Inoue et al. .............................. 257/666
5,521,426  5/1996  Russell ..................................... 257/666
5,559,366  9/1996  Fogal et al. .............................. 257/666
5,633,205  5/1997  Tsuchiya et al. ........................ 438/123
5,635,755  6/1997  Kinghorn ................................. 257/666
5,834,831  11/1998  Kubota et al. .......................... 257/666
5,920,116  7/1999  Umehara et al. ....................... 257/666

FOREIGN PATENT DOCUMENTS 58-186957  11/1983  Japan .
5-31250    4/1993  Japan .
5-243464   9/1993  Japan .
7-066350   3/1995  Japan .
7-245369   9/1995  Japan .

*Primary Examiner*—Kevin M. Picardat
*Attorney, Agent, or Firm*—Oliff & Berridge, PLC

[57] ABSTRACT

The present invention provides for a semiconductor device that facilitates optical recognition to prevent poor wire bonding from occurring. The semiconductor device associated with the present invention comprises a semiconductor chip (20) having a plurality of electrodes and a lead (16) comprising an inner lead portion (16a) connected to each of the electrodes with a wire (24) and an outer lead portion (16b) providing an external terminal. The inner lead portion (16a) is formed with a groove (18) providing a center index portion at a center along its width in a bonding area of the wire (24).

27 Claims, 6 Drawing Sheets

SEMICONDUCTOR DEVICE SUBSTRATE, LEAD FRAME, SEMICONDUCTOR DEVICE AND METHOD OF MAKING THE SAME, CIRCUIT BOARD, AND ELECTRONIC APPARATUS

TECHNICAL FIELD

The present invention relates to a substrate for a semiconductor device, a lead frame, a semiconductor device and a method of making the same, a circuit board, and an electronic apparatus.

DESCRIPTION OF BACKGROUND ART

Known is a method of fabricating a semiconductor device by connecting the electrodes of a semiconductor chip to the leads connected to the external terminals by wire bonding, this method is applied regardless of package form. Also known is a method of fabricating a semiconductor device by use of a lead frame. The following outlines this later method.

As is well known, a semiconductor chip formed with an integrated circuit is mounted on the island of a lead frame with an adhesive, for example. Plural electrode pads on the semiconductor chip are connected to corresponding leads with metal fine wires (or wire). Then, the semiconductor chip and the surroundings thereof are integrally molded for resin encapsulation with a resin such as a synthetic resin. The leads of the outer side of resultant resin-molded package are ultimately separated from the lead frame, and appropriately bent and cut, if necessary. Thus, a semiconductor device can be fabricated.

To attach the metal line wires bonds between the plural electrode pads on the semiconductor chip mounted on the island and the surface of the corresponding leads, a metal line wiring apparatus known as a wire bonder must be programmed to recognize the electrode pads and the corresponding leads. To do so, the edge of each lead must be captured as an optical image to store the contour of the lead in the memory of the wire bonder.

In recognizing the leads of a semiconductor device lead frame, the wire bonder makes use of the external view of each lead as a reference. Therefore, a lead having a defect such as torsion, luster, or rough surface causes a wide variation in the recognition accuracy of the wire bonder.

Recently, the increasing number of pins on one semiconductor device inevitably increases the number of leads thereof and the miniaturization of semiconductor devices accordingly decreases the width of each lead and the interval between leads (or the lead pitch). Currently, a typical lead width is as small as 0.07 mm and a typical lead pitch is 0.16 mm. Consequently, as the lead width and the lead pitch narrow, it is more difficult, when connecting the plural electrode pads arranged on a semiconductor chip to the corresponding leads with metal line wires, for the metal line wire to be connected to the lead at the center along the width of the lead.

Such being the case, attaching the metal line wire to the lead off-center of the width or, detachment of the metal line wire from the lead causes a connection failure. Therefore, no matter how small the lead gets, the center of each lead is must be accurately recognized. Conventionally, however, if the lead has inadequate flatness or distortion, the center of each lead cannot be optically recognized with a high degree of precision.

It is therefore an object of the present invention to provide a semiconductor substrate, a lead frame, a semiconductor device, a method of fabricating the same, a circuit board, and an electronic apparatus that facilitate the optical recognition to prevent poor wire bonding.

DISCLOSURE OF INVENTION (1) A semiconductor device substrate associated with the present invention comprises at least a lead connected to an electrode of a semiconductor element with a wire to form a part of the semiconductor device, the lead having a center index portion at a center along its width in a bonding area of the wire.

This novel arrangement allows reliable optical detection of the center along the width of the lead, thereby shortening the time for detecting the center and, at the same time, enhancing wire bonding positioning accuracy with ease. Consequently, the novel arrangement prevents poor wire bonding.

(2) The center index portion may be one of a dent and a groove.

Bonding a wire to the dent or the groove extends the bonding area between the wire and the lead, thereby providing a significantly high bonding strength. In addition, the novel arrangement provides a high-contrast shade on the lead surface, thereby enhancing the reliability and accuracy of optical detection of the center position along the width of the lead. This further shortens the bonding position detecting time and enhances the positioning accuracy of wire bonding.

Especially, if a groove is provided, the center position along the width of the lead is continuously indicated along the length of the lead. Therefore, a wire bonding position may be set anywhere along the length of the lead without adversely affecting the accuracy and reliability of detecting the center position along the width of the lead. This allows two or more wires to be continuously and accurately bonded to one lead along the length thereof.

(3) The center index portion may be a groove. The lead may be partially resin-encapsulated. The groove may be formed at least in the resin-encapsulated portion.

This arrangement allows the resin-encapsulation to come in contact with the lead by penetrating into the groove, thereby significantly increasing the bonding strength between the resin and the lead.

(4) In the resin-encapsulated portion, the groove may be formed in the region other than an edge of the lead.

This arrangement allows the edge where no groove is formed to function as a stop that prevents the lead from being pulled out of the resin-encapsulation.

(5) The lead may have an inner lead portion for the resin-encapsulated portion and an outer lead portion extending from the resin-encapsulated portion. The groove may be formed extending from the inner lead portion to the outer lead portion.

Forming the groove in the outer lead extends the area in which the outer lead is soldered to a mounting board, thereby enhancing the bonding strength between the board and the outer lead portion.

(6) The semiconductor device substrate is one of a lead frame, a printed board, and a metal board, for example.

(7) The lead frame associated with the present invention has a frame, a island located inside the frame, a joint extending from the frame to the island to support the island, and plural leads extending from the frame toward the island. Each of these leads has a center index portion indicative of the center along the width of the lead. The resent invention is related to the lead frame having the semiconductor device substrate.

(8) The center index portion may be a one of dent and a groove.

(9) The center index portion may be the groove. The lead may be partially resin-encapsulated, the groove being formed at least in the resin-encapsulated portion.

(10) The groove may be formed in regions other than an edge of the lead, in the resin-encapsulated portion.

(11) The lead has an inner lead portion for the resin-encapsulated portion and an outer lead portion extending from the resin-encapsulated portion. The groove may be formed extending from the inner lead portion to the outer lead portion.

(12) A semi conductor device according to the present invention comprises a semiconductor element having a plurality of electrodes and leads, each of the lead having an inner lead portion connected to each of the electrodes with a wire and an outer lead portion providing an external terminal. The inner lead portion at least has a center index portion at its center along its width in a bonding area of the wire.

The arrangement allows optical detection with reliability of the center along the width of the lead, thereby realizing a shortened detecting time and easily enhancing the positioning accuracy of wire bonding. In addition, because no wire-bonding failure occurs, the product quality is enhanced.

(13) The center index portion may be one of a dent and a groove.

(14) The center index portion is the groove, and the above-mentioned inner lead portion may be resin-encapsulated.

(15) The inner lead portion may be formed with the groove in the inner lead portion except at the edge thereof.

(16) The groove may be formed extending from the inner lead portion to the outer lead portion.

(17) A semiconductor device fabricating method according to the present invention comprises a step of preparing a semiconductor element and a lead having a center index portion at its center along its width; a step of positioning the lead and the semiconductor element, and a step of bonding a wire to the lead at the center index portion by optically recognizing the center index portion.

Such an arrangement allows optical detection with reliability of the center position along the width of the lead, thereby saving detection time and easily enhancing the positioning accuracy in wire bonding. Consequently, this arrangement prevents poor wire bonding.

As the number of pins of a semiconductor package increases, the number of leads increases accordingly in a range from 200 to 300. With such multiple-pin packages, the present invention can enhance the above-mentioned detection accuracy and save the above-mentioned detection time in the wire bonding process.

(18) The lead may provide a part of a lead frame.

(19) The lead preparation step may include a process for forming one of dent and a groove for providing the center index portion on the lead by at least one of pressing, etching, and laser techniques.

When the pressing technique is selected, the dent or the groove may be formed in each lead by coining. When the etching technique is selected, the dent or the groove may be formed in each lead by half-etching. If at least the pressing technique or the etching technique is used for forming the dent or the groove in each lead, the etching process or the pressing process for use in fabricating conventional lead frames may be used, thereby eliminating the necessity for installing new facilities.

(20) A circuit board associated with the present invention is equipped with the above-mentioned semiconductor device.

(21) An electronic apparatus associated with the present invention utilizes the above-mentioned circuit board.

BEST MODE FOR CARRYING OUT THE INVENTION

Figure 1:
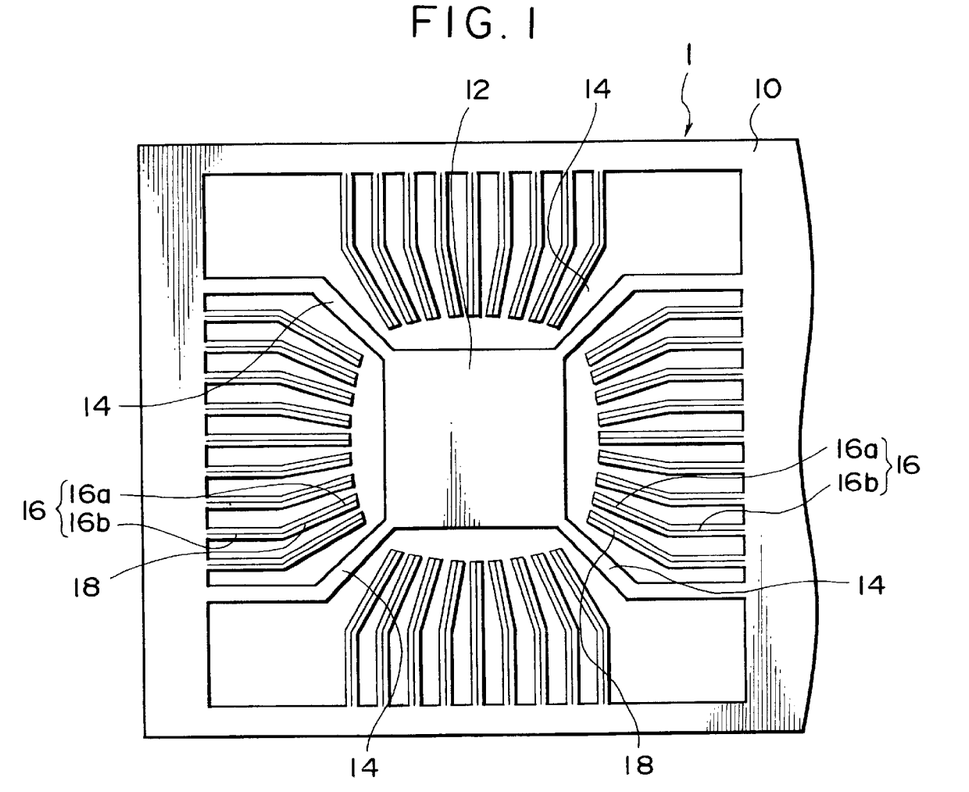
FIG. 1 illustrates a view of a lead frame practiced as one preferred embodiment of the invention.

This invention will be described in further detail by way of example with reference to the accompanying drawings. FIG. 1 shows a plan view of a lead frame for use in a semiconductor device practiced as one embodiment. This view shows only a part of the lead frame that actually extends in certain directions (the left and right in the figure), continuously carrying the same patterns having a long shape.

An outer frame 10 supports inner members (to be described later) and is indicated at the very top and bottom, and furthest right and left of the drawing. A carrying hole (sprocket hole), not shown, for carrying the lead frame itself is appropriately disposed on the outer frame 10.

An island 12 provides a base on which a semiconductor chip 20 (refer to FIG. 3) is securely mounted. As shown, the island is located inside the outer frame 10 and a part of it is located at the center of the lead frame 1, at generally (generally located at the center but not necessarily to be the center thereof).

A joint 14 extends from the outer frame 10 to the island 12 to support the island 12. In this example, four joints are provided to support the island 12 at the four corners thereof. However, the number of joints 14 is not limited to four. Any number of joints in a known range may be used.

A lead 16 is provided in plural as shown, extending from 4 side of the outer frame toward the island 1. The lead 16 is composed of an inner lead 16a and an outer lead 16b. The inner lead 16a is connected to a corresponding electrode pad 22 of the semiconductor chip 20 when the semiconductor chip 20 (see FIG. 3) is mounted, providing electrical conductance. The inner lead 16a remains in a resin area after the semiconductor chip 20 is encapsulated with resin. The outer lead 16b provides an external terminal as shown in FIG. 4.

Figure 2:
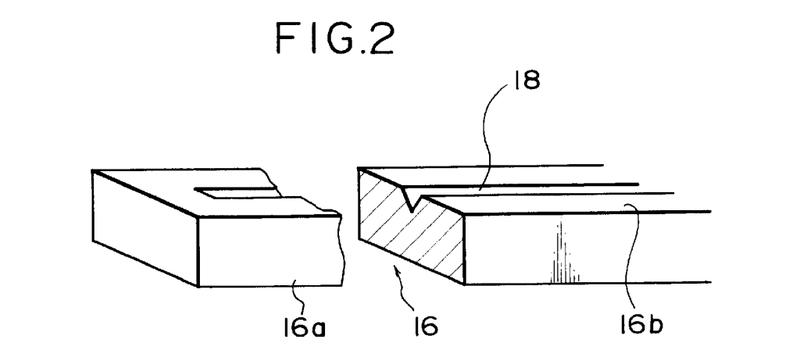
FIG. 2 is an expanded perspective view of an inner lead.

The each lead 16 is formed with a groove 18 (center index portion) at the center of the width thereof. FIG. 2 shows an expanded view of the lead 16. As shown in FIG. 2, the groove 18 has a "V" shape in cross section. The V-shaped groove 18, formed in the thickness direction of the lead 16, runs continuously from the inner lead 16a to the outer lead 16b of the lead 16 maintaining the same V-shape. However, the edge of the inner lead 16a is not provided with the groove 18 as shown in FIG. 2. This arrangement causes a mold resin 32 (refer to FIG. 4) set in the groove 18 to be caught by the edge of the inner lead 16a when the inner lead 16a is resin-encapsulated in a later process, thereby preventing the lead 16 from being pulled out of the encapsulation. It should be noted that the groove 18 may be formed only in the bonding area of the inner lead 16a in which a wire bond 24 is connected to the inner lead 16a.

The lead 16 is about 0.15 mm thick. The V-shaped groove 18 is a shallow groove of about 0.05 mm at deepest relative to the thickness of the lead 16.

The groove 18 can be formed in a pressing process where the lead frame 1 is formed from a metal tape. Conventionally, following methods are available for forming the lead frame 1: a method of etching a photographically processed metal tape having a constant thickness; and a punching method by pressing. In the fabricating method by pressing, the shallow V-shaped groove 18 can be formed by a technique known as coining.

Alternatively, the groove 18 can be formed by a laser process. Lead frame 1 can be fabricated by a method of etching a photographically processed metal tape having a constant thickness and a punching method by pressing. Both of the above-mentioned fabrication methods are applicable to the present invention.

The present embodiment is formed so that the edges of the plural leads 16 enclose the four sides of the island 12 on which the semiconductor chip 20 is mounted. It will be apparent to those skilled in the art that the leads 16 may be arranged on only two or three sides of the island 12, for example.

According to the present embodiment, (1) however small the width of the lead 16, the center along the width is always indexed by the groove 18, so that optical recognition can be performed with a high degree of accuracy, thereby enhancing both the bonding accuracy of the wire 24 and the product yield; (2) positional recognition with a high degree of accuracy is provided without being much affected by the distortion or variation in surface flatness of the lead 16; (3) even if the lead 16 has a distortion or a variation in surface flatness, bonding to the lead 16 is performed at the center along the width thereof, so that the connection (or connection strength) between the lead 16 and the wire 24 is kept in a good state, thereby preventing the wire 24 from being pushed away to come to contact with an adjacent wire 24 in a later resin-encapsulating process; (4) as the bonding accuracy increases, the product reliability increases accordingly; and (5) the time for programming the wire bonder to recognize the leads 16 corresponding to the plural electrode pads on the semiconductor chip 20 mounted on the island 12 to bond wire 24 to the surface of the lead 16 is saved, resulting in enhanced productivity. The methods of fabricating the lead frame 1, namely, etching and punching, can be employed without added cost.

Figure 3:
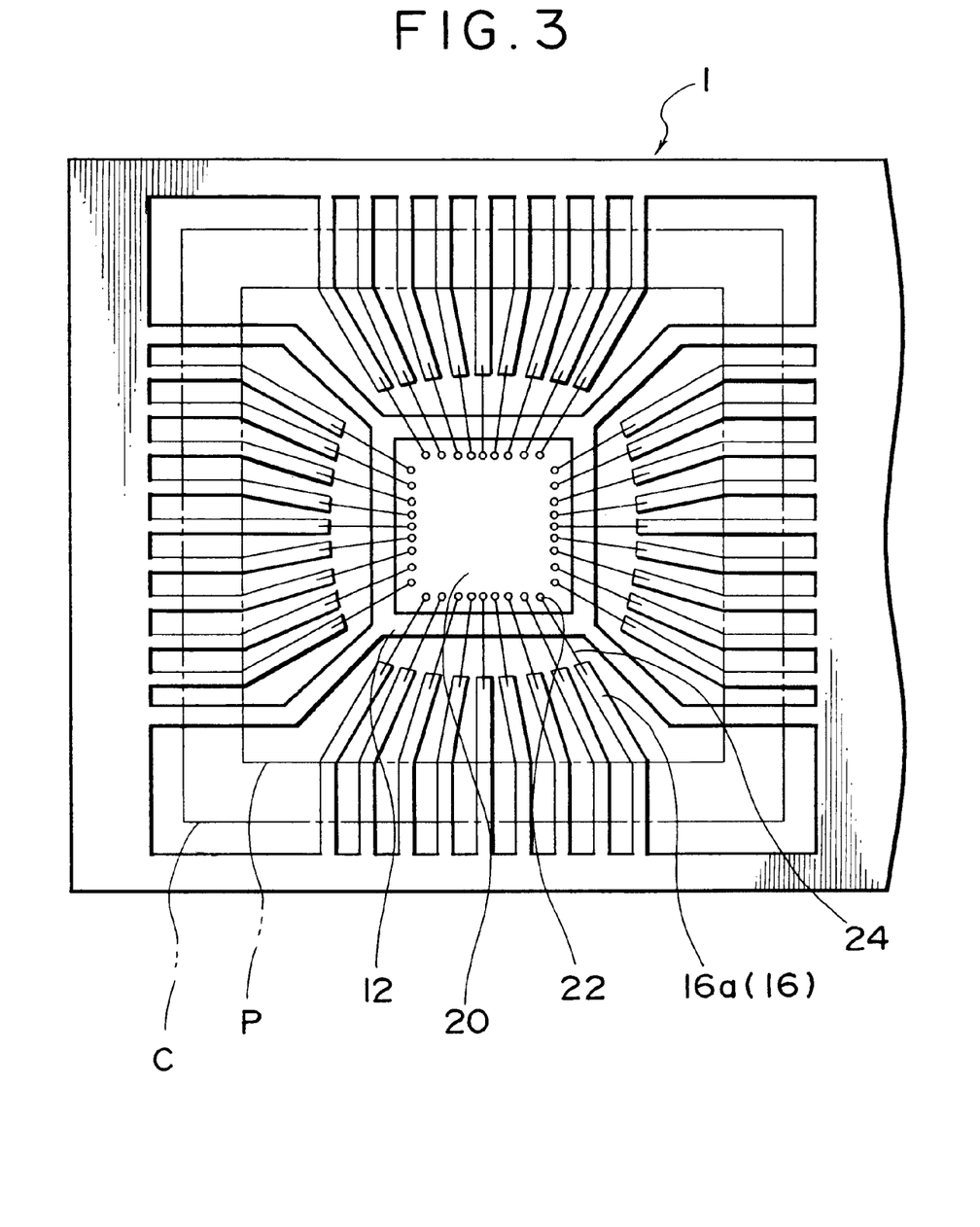
FIG. 3 is a diagram for describing a method of fabricating a semiconductor device.
Figure 4:
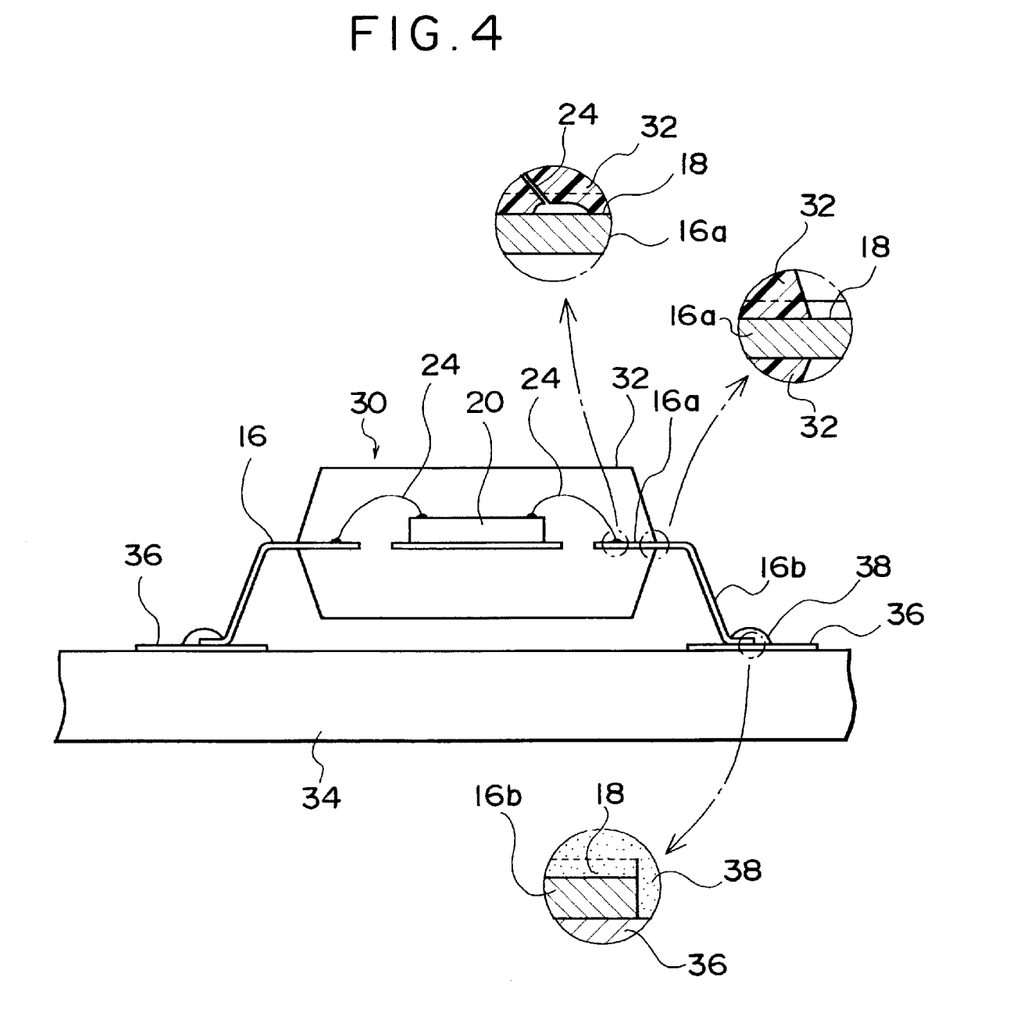
FIG. 4 is a schematic view illustrating a semiconductor device mounted on a circuit board.

FIG. 3 shows the lead frame 1 and the semiconductor chip mounted on the same in the wire-bonded state. As shown, the semiconductor chip 20 is adhesively attached to the island 12 of the lead frame 1. This attachment may be made with a conductive adhesive member. Connecting the island 12 and the joint 14 to GND potential sets the adhesion surface of the semiconductor chip to GND potential. The electrode pad 22 of the semiconductor chip 20 is bonded to the inner lead 16a of the lead 16 with the wire 24. To be more specific, the wire 24 is bonded inside the groove 18 (not shown in FIG. 3) of the inner lead 16a. This arrangement extends the bonding area because the inside area of the groove 18 is greater than the flat area of the lead 16, thereby increasing the bonding strength. The increased bonding strength eliminates the need for gold- or silver-plating of the inner lead 16a. The elimination of the plating prevents the adhesion between the inner lead 16a and the mold resin from deteriorating.

In FIG. 3, one wire 24 is bonded to each lead 16. In the present embodiment, the groove 18 is continuously formed along the lead 16, so that two or more wires 24 may be bonded in the groove 18 of each lead 16.

Then, an area enclosed by a dash double-dot line P shown in FIG. 3 is resin-encapsulated and an area indicated by a dash double-dot line C shown in FIG. 3 is punched out to provide a semiconductor device. FIG. 4 shows the semiconductor device thus fabricated as mounted on a circuit board.

As shown in FIG. 4, an area of a semiconductor device 30 including the semiconductor chip 20, the inner lead 16a, and the wire 24 is encapsulated with the mold resin 32.

The wire 24 is bonded in the groove 18 formed on the inner lead 16a. Therefore, the bonding area becomes large, resulting in a large bonding strength between the wire 24 and the inner lead 16a. In addition, the mold resin 32 enters the groove 18, so that the contact area between the lead 16 and the mold resin 32 increases, thereby increasing the bonding strength therebetween. The introduction of the resin mold 32 into the groove 18 also prevents the lead 16 from shifting in the direction intersecting the groove 18. The edge of the inner lead 16a is not formed with the groove 18 as described with reference to FIG. 2. Consequently, the mold resin 32 flowing through the groove 18 is caught by the edge of the inner lead 16a, thereby preventing the lead 16 from pulling out of the encapsulation.

A mounting board 34 is formed with a wiring pattern 36. The outer lead 16b of the semiconductor device 30 is bonded to the wiring pattern 36 by a solder 38. In the present embodiment, the outer lead 16b is also provided with the groove 18, so that the solder 38 enters the groove 18. The bonding area between the solder 38 and the outer lead 16b becomes large, thereby increasing the bonding strength.

Figure 5:
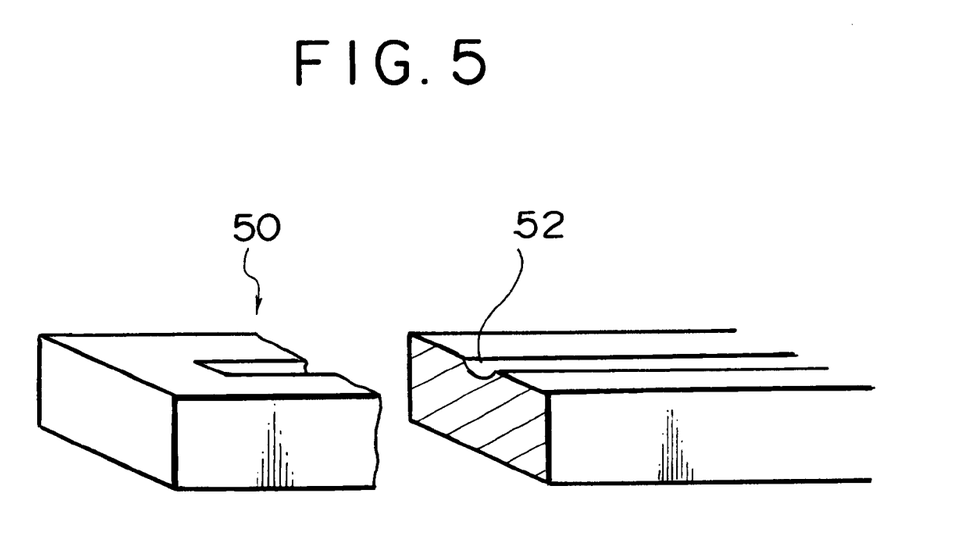
FIG. 5 is a diagram illustrating a modification of the embodiment of the present invention.

FIGS. 5 through 8 shows variations to the present embodiment. For example, FIG. 5 shows a modification of the groove 18. In the figure, a lead 50 is provided with a groove 52 having an arc cross-section. Except for the shape of the groove 52, the lead 50 is generally the same as the lead 16 shown in FIG. 2. This shape of groove 52 is formed in an etching process or a pressing process of the lead frame. In the etching process, such a shallow round groove is formed by a shallow etching technique known as half-etching. In the pressing process, such a shallow round groove is formed by a technique known as coining.

Figure 6:
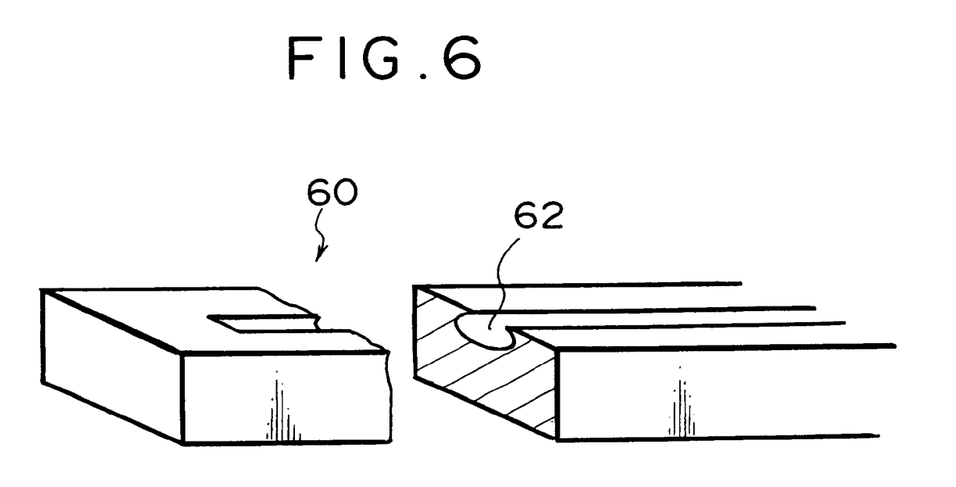
FIG. 6 is a diagram illustrating another modification of the embodiment of the present invention.

A groove 62 of a lead 60 shown in FIG. 6 becomes wider with depth. The groove 62 is formed by isotropic etching. The groove 62 of this shape makes it harder for a member put in the groove to pull out therefrom. For example, a ball bond produced by melting the wire to be bonded, a mold resin, and a solder used for bonding with the mounting board that were put in the groove 62 of the lead 60 can be removed from the groove only with difficulty.

Figure 7:
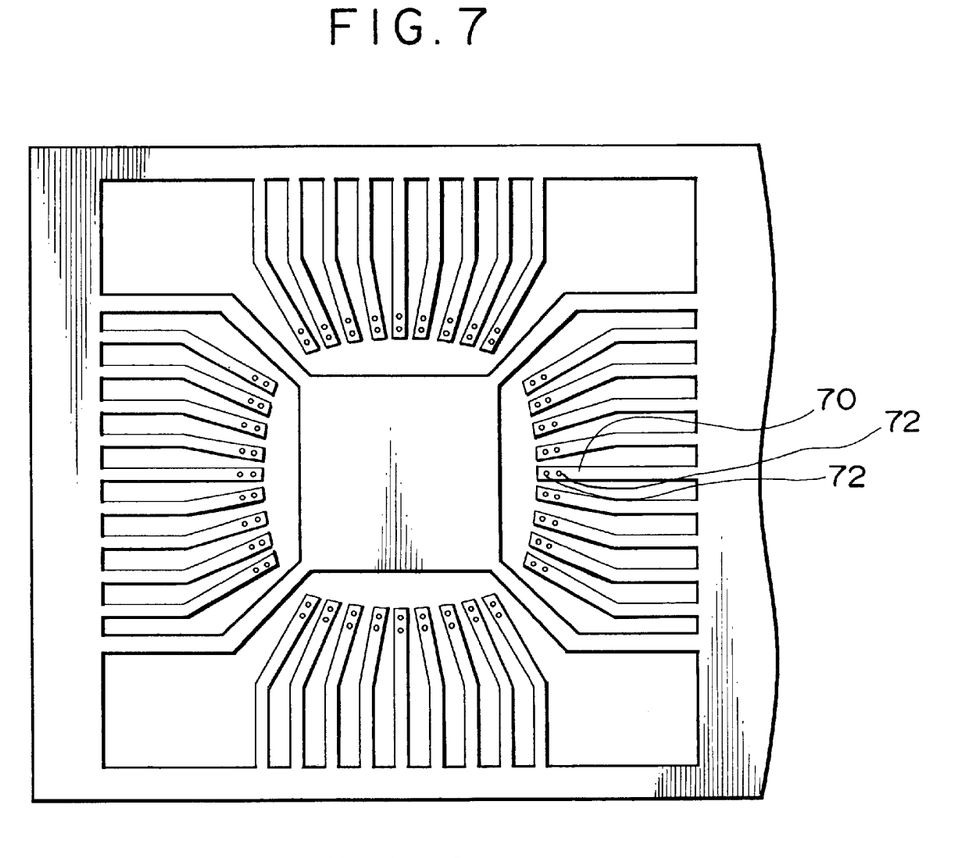
FIG. 7 is a diagram illustrating still another modification of the embodiment of the present invention.
Figure 8:
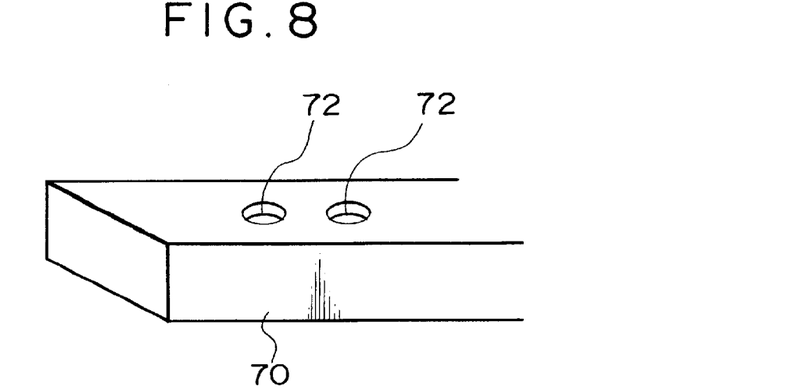
FIG. 8 is an expanded perspective view of an inner lead of the modification in FIG. 7.

FIG. 7 shows a plan view of another modification. FIG. 8 shows an expanded view of this modification. In these figures, a lead 70 is provided at the center along the width thereof with dents 72. These dents 72 are spaced at a predetermined distance (about 0.1 mm to 0.2 mm) from the edge of the lead 70. This arrangement allows a wire to be bonded to the lead 70 by thermo-compression in a wire connecting process. Consequently, the cross section area of the connection of the thermo-compression-bonded wire has a diameter three times as large as the original diameter of the wire. Because the dents 72 are also formed on the center of the lead 70, the positioning for wire bonding is facilitated and, at the same time, the bonding strength is increased.

Like the modification mentioned above, the dents 72 are formed by providing shallow round pits by half-etching in the etching process or coining in the pressing process.

In each of the above-mentioned embodiments, the present invention is applied to the lead frame. It will be apparent to those skilled in the art that the present invention is also applicable to other than the lead frame. For example, the same advantages as mentioned above are attained when the center index portion is formed in each of the leads of a printed board or a metal board. In this case, the lead 16 shown in FIG. 1 is formed on an insulator film or a metal sheet.

Figure 9:
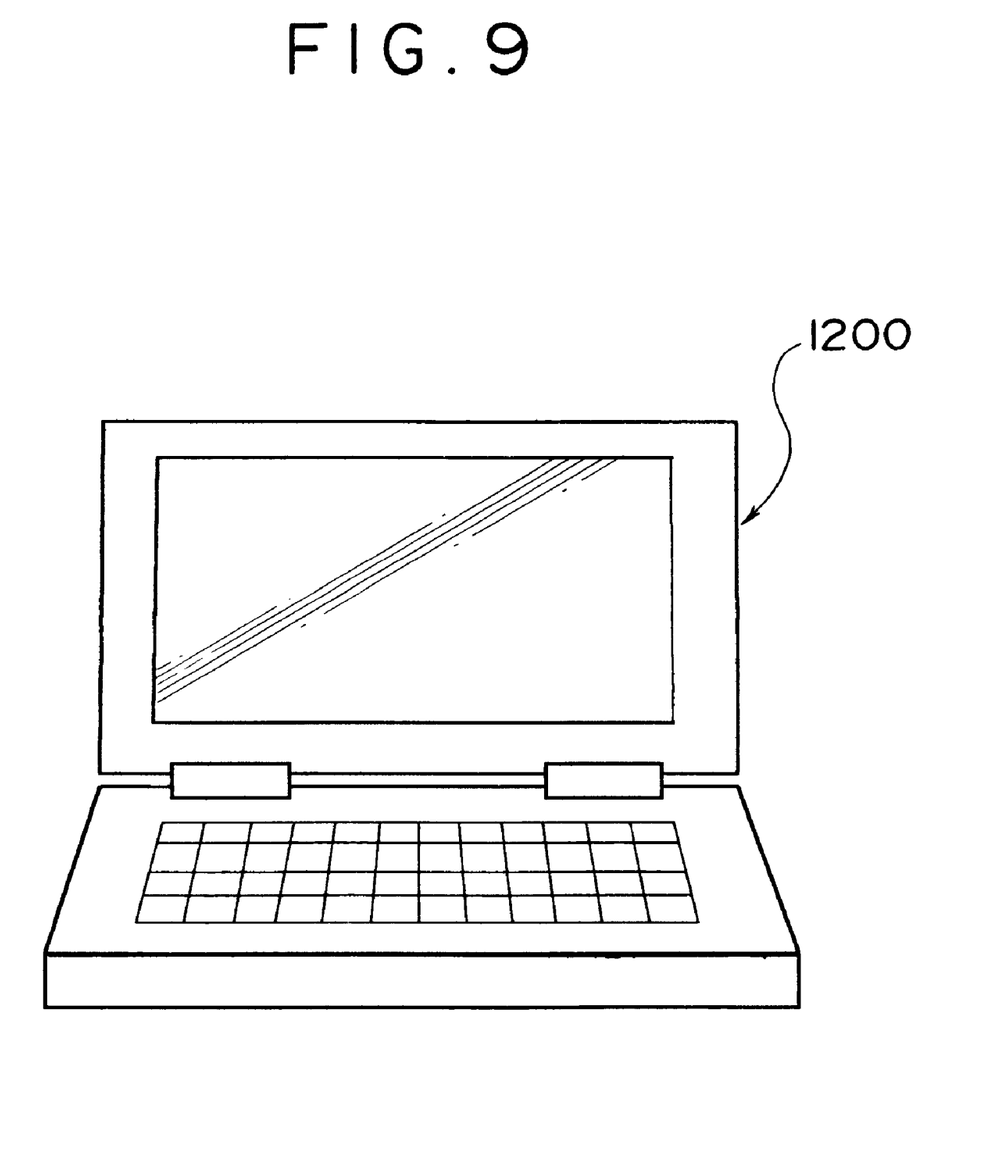
FIG. 9 is a diagram illustrating an electronic apparatus having a circuit board equipped with a semiconductor device associated with the present invention.

FIG. 9 shows a notebook-size personal computer 1200 as an electronic apparatus having a circuit board equipped with the above-mentioned semiconductor device.

What is claimed is:

1. A method of making a semiconductor device comprising:
    a step of preparing a semiconductor element and a lead having a center index portion at its center along its width, the center index portion being one of a dent and a groove, the center index portion being formed in regions other than an edge of the lead;
    a step of positioning the lead and the semiconductor element; and
    a step of bonding a wire to the lead at the center index portion by optically recognizing the center index portion.

2. The method of making a semiconductor device as claimed in claim 1, wherein the lead is a part of a lead frame.

3. The method of making a semiconductor device as claimed in claim 1, wherein the lead preparing step includes a process for forming the center index portion on the lead by at least one of pressing, etching, and laser techniques.

4. A method of making a semiconductor device comprising:
    a step of preparing a semiconductor element and a lead having an inner lead portion and an outer lead portion, the lead having a center index portion at its center along its width, the center index portion being a groove, the groove being formed extending from the inner lead portion to the outer lead portion;
    a step of positioning the lead and the semiconductor element; and
    a step of bonding a wire to the lead at the center index portion by optically recognizing the center index portion.

5. The method of making a semiconductor device as claimed in claim 4, wherein the lead is a part of a lead frame.

6. The method of making a semiconductor device as claimed in claim 4, wherein the lead preparing step includes a process for forming the center index portion on the lead by at least one of pressing, etching, and laser techniques.

7. A semiconductor device substrate comprising a lead connected to an electrode of a semiconductor element with a wire to form a part of a semiconductor device, said lead having a center index portion at a center along its width in a bonding area of the wire, the center index portion being one of a dent and a groove, the center index portion being formed in regions other than an edge of the lead.

8. The semiconductor device substrate as claimed in claim 7, wherein the center index portion is the dent and the dent is spaced at a predetermined distance from the edge of the lead.

9. The semiconductor device substrate as claimed in claim 7, wherein the center index portion becomes wider with depth.

10. The semiconductor device substrate as claimed in claim 7, wherein the lead has an inner lead portion and an outer lead portion and the inner lead portion is formed without plating thereon.

11. The semiconductor device substrate as claimed in claim 7, wherein the semiconductor device substrate is one of a printed board and a metal board.

12. The semiconductor device substrate as claimed in claim 7,
    wherein the semiconductor device substrate is a lead frame, the lead frame having a frame, an island arranged inside the frame, a joint extending from the frame toward the island to support the island, and the lead,
    wherein the lead extends from the frame toward the island.

13. A semiconductor device comprising a semiconductor element having a plurality of electrodes and leads, each of the leads having an inner lead portion connected to each of the electrodes with a wire and an outer lead portion providing an external terminal, said inner lead portion having a center index portion at its center along its width in a bonding area of said wire, the center index portion being one of a dent and a groove, the center index portion being formed in regions other than an edge of the lead.

14. The semiconductor device as claimed in claim 13, wherein the inner lead portion is made to be flat.

15. The semiconductor device as claimed in claim 13, wherein the wire is bonded inside the center index portion.

16. A circuit board on which the semiconductor device claimed in claim 13 is mounted.

17. An electronic apparatus having the circuit board as claimed in claim 16.

18. A semiconductor device substrate comprising a lead connected to an electrode of a semiconductor element with a wire to form a part of a semiconductor device device, the lead having an inner lead portion and an outer lead portion, the lead having a center index portion at a center along its width in a bonding area of the wire, the center index portion being a groove, the groove being formed extending from the inner lead portion to the outer lead portion.

19. The semiconductor device substrate as claimed in claim 18, wherein the center index portion becomes wider with depth.

20. The semiconductor device substrate as claimed in claim 18, wherein the inner lead portion is formed without plating thereon.

21. The semiconductor device substrate as claimed in claim 18, wherein the semiconductor device substrate is one of a printed board and a metal board.

22. The semiconductor device substrate as claimed in claim 18,
    wherein the semiconductor device substrate is a lead frame, the lead frame having a frame, an island arranged inside the frame, a joint extending from the frame toward the island to support the island, and the lead, wherein the lead extends from the frame toward the island.

23. A semiconductor device comprising a semiconductor element having a plurality of electrodes and leads, each of the leads having an inner lead portion connected to each of the electrodes with a wire and an outer lead portion providing an external terminal, the lead having a center index portion at a center along its width, the center index portion being a groove, the groove being formed extending from the inner lead portion to the outer lead portion.

24. The semiconductor device as claimed in claim 23, wherein the inner lead portion is made to be flat.

25. The semiconductor device as claimed in claim 23, wherein the wire is bonded inside the groove.

26. A circuit board on which the semiconductor device claimed in claim 23 is mounted.

27. An electronic apparatus having the circuit board as claimed in claim 26.

* * * * *